US009536908B2

(12) United States Patent
Chung et al.

(10) Patent No.: US 9,536,908 B2
(45) Date of Patent: Jan. 3, 2017

(54) THIN FILM TRANSISTOR ARRAY PANEL

(71) Applicant: Samsung Display Co., Ltd., Yongin (KR)

(72) Inventors: Yung Bin Chung, Seoul (KR); Chul-Hyun Baek, Asan-si (KR); Eun Jeong Cho, Busan (KR); Jung Yun Jo, Namyangju-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/799,995

(22) Filed: Jul. 15, 2015

(65) Prior Publication Data

US 2016/0204125 A1 Jul. 14, 2016

(30) Foreign Application Priority Data

Jan. 13, 2015 (KR) ........................ 10-2015-0006322

(51) Int. Cl.
*H01L 27/14* (2006.01)
*H01L 27/12* (2006.01)
(Continued)

(52) U.S. Cl.
CPC ......... *H01L 27/124* (2013.01); *H01L 21/0217* (2013.01); *H01L 27/1248* (2013.01);
(Continued)

(58) Field of Classification Search
CPC . H01L 27/124; H01L 27/1248; H01L 27/1259
(Continued)

(56) References Cited

U.S. PATENT DOCUMENTS

| 7,871,940 B2 | 1/2011 | Schropp et al. |
| 8,563,095 B2 | 10/2013 | Rajagopalan et al. |
| 2004/0018750 A1 | 1/2004 | Sophie et al. |

FOREIGN PATENT DOCUMENTS

| KR | 10-0279265 | 2/2001 |
| KR | 10-0488939 | 5/2005 |

(Continued)

OTHER PUBLICATIONS

No et al., "Characteristics of Low Temperature SiNx films Deposited by using Highly Diluted Silane in Nitrogen", Korean Journal of Metals and Materials, 2012, p. 613-618, vol. 50, No. 8.
(Continued)

*Primary Examiner* — Douglas Menz
(74) *Attorney, Agent, or Firm* — H.C. Park & Associates, PLC

(57) ABSTRACT

A thin-film transistor array panel includes an insulation substrate, a gate line disposed on the insulation substrate, a gate insulating layer disposed on the gate line, a semiconductor layer disposed on the gate insulating layer, a data line disposed on the semiconductor layer and including a source electrode, a drain electrode disposed on the semiconductor layer and facing the source electrode, a first electrode disposed on the gate insulating layer, a first passivation layer disposed on the first electrode and including silicon nitride, a second passivation layer disposed on the first passivation and including silicon nitride, and a second electrode disposed on the passivation layer, in which a first ratio of nitrogen-hydrogen bonds to silicon-hydrogen bonds in the first passivation layer is different from a second ratio of nitrogen-hydrogen bonds to silicon-hydrogen bonds in the second passivation layer.

20 Claims, 9 Drawing Sheets

(51) Int. Cl.
  *H01L 29/66* (2006.01)
  *H01L 29/786* (2006.01)
  *H01L 29/417* (2006.01)
  *H01L 21/02* (2006.01)

(52) U.S. Cl.
  CPC .... *H01L 27/1259* (2013.01); *H01L 29/41733* (2013.01); *H01L 29/66765* (2013.01); *H01L 29/78606* (2013.01); *H01L 29/78669* (2013.01); *H01L 29/78678* (2013.01)

(58) Field of Classification Search
  USPC .......................................................... 257/72
  See application file for complete search history.

(56) References Cited

FOREIGN PATENT DOCUMENTS

| KR | 10-2007-0010026 | 1/2007 |
| KR | 10-2009-0121771 | 11/2009 |
| KR | 10-2013-0050918 | 5/2013 |

OTHER PUBLICATIONS

Jaeyoung Park, et al., "Gas breakdown in an atmospheric pressure radio-frequency capacitive plasma source", Journal of Applied Physics, Jan. 1, 2001, vol. 89, No. 1.

THIN FILM TRANSISTOR ARRAY PANEL

CROSS-REFERENCE TO RELATED APPLICATION

This application claims priority from and the benefit of Korean Patent Application No. 10-2015-0006322, filed on Jan. 13, 2015, which is hereby incorporated by reference for all purposes as if fully set forth herein.

BACKGROUND

Field

Exemplary embodiments of the present invention relate to a thin-film transistor array panel including passivation layers.

Discussion of the Background

A liquid crystal display is one of flat panel displays that may include two display panels in which electric field generating electrodes, such as a pixel electrode and a common electrode, are disposed, and a liquid crystal layer disposed between the two display panels. An image may be displayed in a liquid crystal display by applying a voltage to the electric field generating electrodes to generate an electric field, determining alignment of liquid crystal molecules, and controlling polarization of incident light.

The liquid crystal display may be easily designed to be thinner, but may have low visibility from lateral sides compared to visibility from front sides. Liquid crystal alignments and driving methods have been developed to improve side visibility. A liquid crystal display that may include all electric field generating electrodes in a single substrate has been studied, as a method for implementing a wide view angle.

A thin-film transistor array panel used for a liquid crystal display in which all electric field generating electrodes are formed in one substrate may include a passivation layer for protecting a channel of a thin-film transistor. Arcing may occur between metals formed on a deposition apparatus and the substrate when depositing the passivation layer, which may generate a defect on the substrate.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the present invention provide a thin-film transistor array panel used for a liquid crystal display in which two field generating electrodes are formed in a single substrate, to prevent generation of arcing during deposition of a passivation layer.

Additional aspects will be set forth in the detailed description which follows, and, in part, will be apparent from the disclosure, or may be learned by practice of the inventive concept.

According to an exemplary embodiment of the present invention, a thin-film transistor array panel includes an insulation substrate, a gate line disposed on the insulation substrate, a gate insulating layer disposed on the gate line, a semiconductor layer disposed on the gate insulating layer, a data line disposed on the semiconductor layer and including a source electrode, a drain electrode disposed on the semiconductor layer and facing the source electrode, a first electrode disposed on the gate insulating layer, a first passivation layer disposed on the first electrode and including silicon nitride, a second passivation layer disposed on the first passivation and including silicon nitride, and a second electrode disposed on the passivation layer, in which a first ratio of nitrogen-hydrogen bonds to silicon-hydrogen bonds in the first passivation layer is different from a second ratio of nitrogen-hydrogen bonds to silicon-hydrogen bonds in the second passivation layer.

The first ratio may be in a range of 22 to 24.

The first passivation layer may have a thickness in a range of 200 Å to 400 Å.

The second ratio may be in a range of 0.9 to 1.1.

The second passivation layer may have a thickness in a range of 2600 Å to 2800 Å.

The thin-film transistor array panel may further include a reference electrode line disposed on the same layer with the gate line and spaced apart from the gate line, and the reference electrode line may include a connection part protruding downwards.

The first electrode may have a plate shape and the second electrode may include branch electrodes.

The first electrode may be a pixel electrode and the second electrode may be a reference electrode.

The thin-film transistor array panel may further include a reference electrode line exposure opening disposed in the gate insulating layer, the first passivation layer, and the second passivation layer and exposing the connection part.

The first electrode may be disposed and directly connected to the drain electrode, and the second electrode may be connected to the connection part through the reference electrode line exposure opening.

The first electrode may be a reference electrode and the second electrode may be a pixel electrode.

The thin-film transistor array panel may further include an interlayer insulating layer disposed on the first passivation layer, the gate insulating layer, the data line, and the drain electrode, and the first electrode may be disposed on the interlayer insulating layer.

The gate insulating layer and the interlayer insulating layer may include a reference electrode line exposure opening exposing the connection part.

The first electrode is connected to the connection part through the reference electrode line exposure opening.

The gate insulating layer, the interlayer insulating layer, the first passivation layer, and the second passivation layer may include a drain electrode exposure opening exposing the drain electrode.

The second electrode may be connected to the drain electrode through the drain electrode exposure opening.

The thin-film transistor array panel may further include a first ohmic contact disposed between the drain electrode and the semiconductor layer, and a second ohmic contact disposed between the source electrode and the semiconductor layer.

According to an exemplary embodiment of the present invention, a method of forming a thin-film transistor array panel includes forming a gate line on an insulation substrate, forming a gate insulating layer on the gate line, forming a semiconductor layer on the gate insulating layer, forming a source electrode and a drain electrode on the semiconductor layer to face each other, forming a first electrode on the gate insulating layer, forming a first passivation layer having a first ratio of nitrogen-hydrogen bonds to silicon-hydrogen bonds on the first electrode, forming a second passivation layer having a second ratio of nitrogen-hydrogen bonds to silicon-hydrogen bonds different from the first ratio on the first passivation layer, and forming a second electrode on the passivation layer, in which the first and second passivation layers comprise silicon nitride.

The first passivation layer may have a thickness in a range of 200 Å to 400 Å, the second passivation layer may have a thickness in a range of 2600 Å to 2800 Å, the first ratio may be in a range of 22 to 24, the second ratio may be in a range of 0.9 to 1.1, and the first electrode may be a pixel electrode and the second electrode may be branch electrodes.

The first passivation layer may have a thickness in a range of 200 Å to 400 Å, the second passivation layer may have a thickness in a range of 2600 Å to 2800 Å, the first ratio may be in a range of 22 to 24, the second ratio may be in a range of 0.9 to 1.1, and the first electrode may be branch electrodes and the second electrode may be a pixel electrode.

According to exemplary embodiments of the present invention, a first and second passivation layers having different ratios of nitrogen-hydrogen bonds (N—H) to silicon-hydrogen bonds (Si—H) may be disposed in a dual structure, and the first passivation layer may have the ratio of nitrogen-hydrogen bonds (N—H) to silicon-hydrogen bonds (Si—H) in a range of 22 to 24, to prevent occurrence of arcing during a process of forming the passivation layer, and thereby preventing a damage to a substrate.

According to exemplary embodiments of the present invention, a thin-film transistor array panel may improve transmittance from the passivation layer having dual structure.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
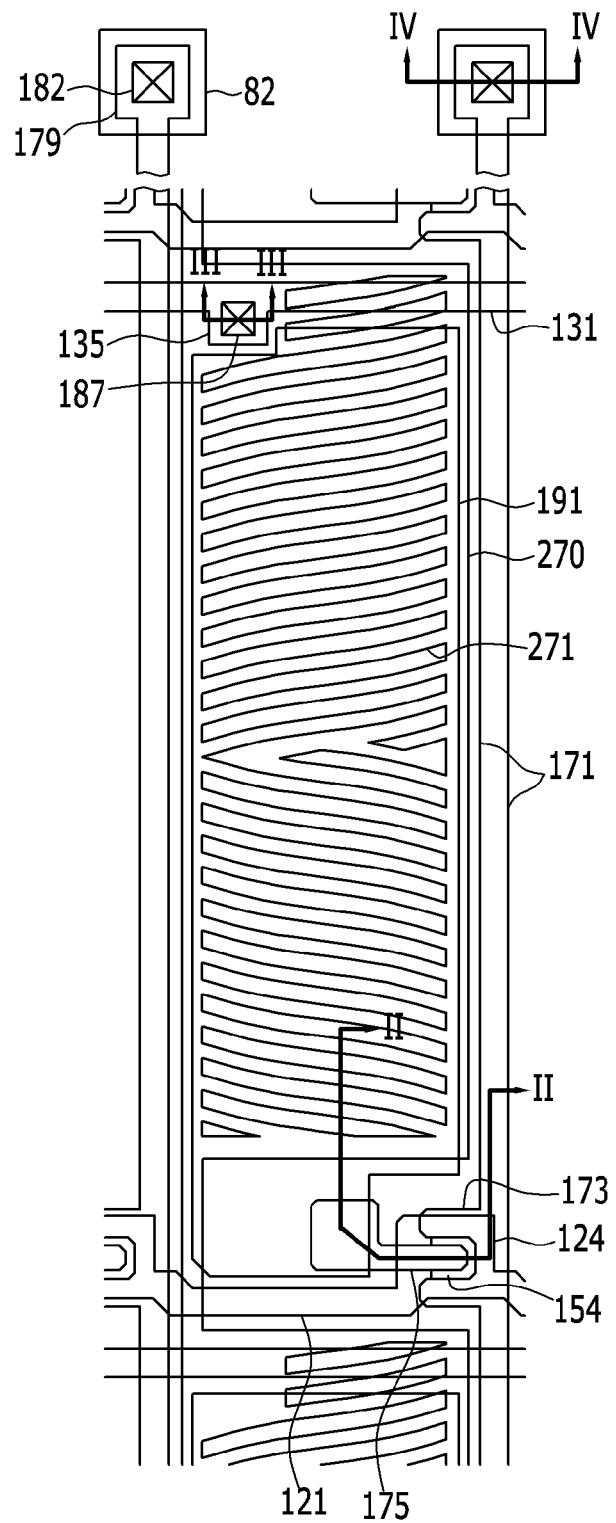
FIG. 1 is a layout view illustrating a thin-film transistor array panel according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
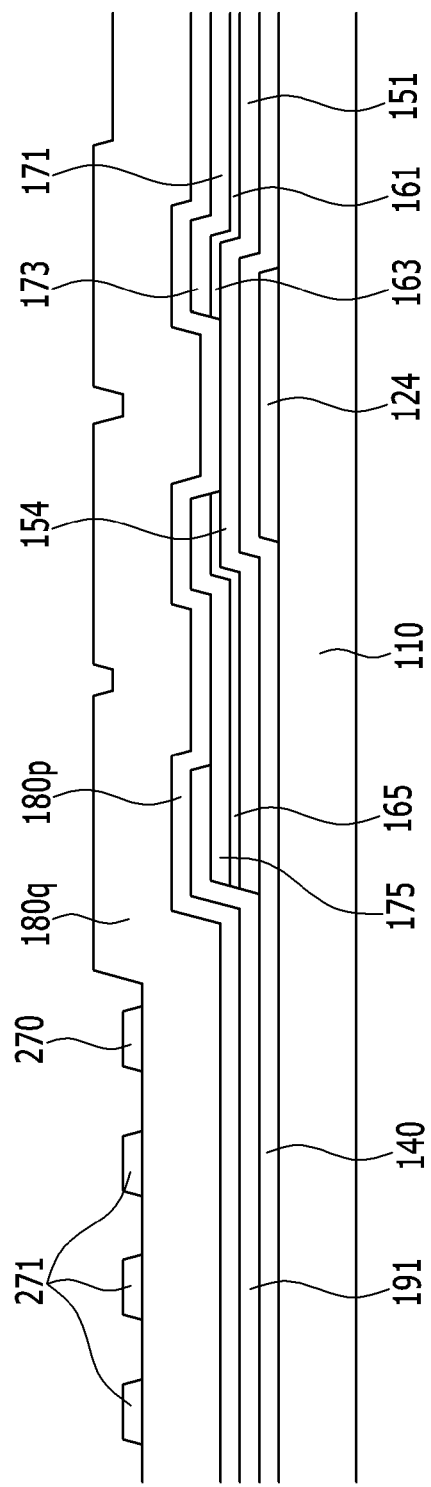
FIG. 2 is a cross-sectional view of the thin-film transistor array panel of FIG. 1, taken along line II-II.
Figure 3:
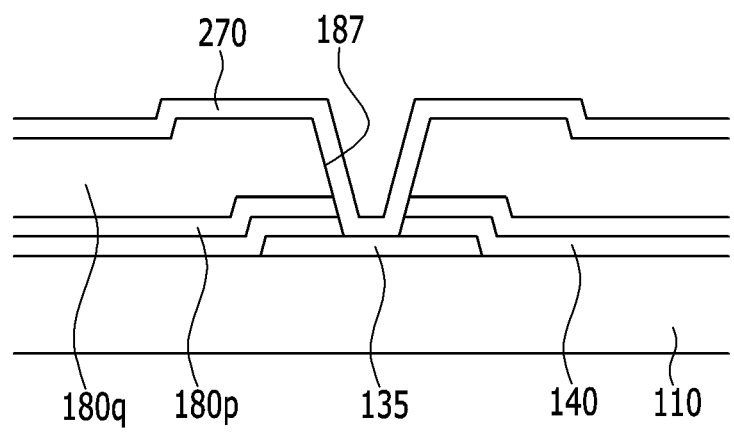
FIG. 3 is a cross-sectional view of the thin-film transistor array panel of FIG. 1, taken along line III-III.
Figure 4:
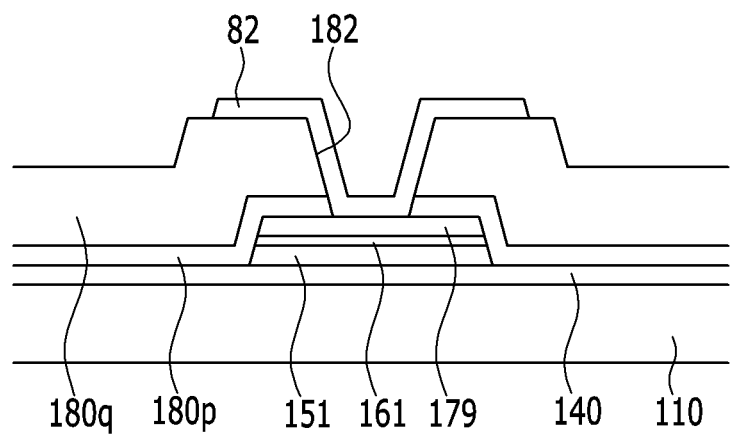
FIG. 4 is a cross-sectional view of the thin-film transistor array panel of FIG. 1, taken along line IV-IV.

FIG. 1 is a layout view illustrating a thin-film transistor array panel according to an exemplary embodiment of the present invention. FIG. 2 is a cross-sectional view of the thin-film transistor array panel of FIG. 1, taken along line II-II. FIG. 3 is a cross-sectional view of the thin-film transistor array panel of FIG. 1, taken along line III-III. FIG. 4 is a cross-sectional view of the thin-film transistor array panel of FIG. 1, taken along line IV-IV.

Referring to FIGS. 1 to 4, the thin-film transistor array panel according to the present exemplary embodiment includes gate lines 121 and reference electrode lines 131, which are disposed on an insulation substrate 110 made of a transparent glass or plastic material.

Each of the gate lines 121 transfers a gate signal and substantially extends in a horizontal direction. Each of the gate lines 121 includes gate electrodes 124 protruding upward therefrom and a gate pad (not shown) for connection to another layer or an external driving circuit. A gate driving circuit (not shown) that generates a gate signal may be mounted on a flexible printed circuit film (not shown) attached to the insulation substrate 110, directly mounted on the insulation substrate 110, or integrated on the insulation substrate 110. When the gate driving circuit is integrated on the insulation substrate 110, the gate line 121 may extend to and be directly connected to the gate driving circuit.

The reference electrode lines 131 receive a reference voltage, and extend substantially parallel to the gate line 121. Each of the reference electrode lines 131 includes connection parts 135, each protruding downward from the reference electrode line 131 in plane view.

A gate insulating layer 140 made of silicon nitride (SiNx), silicon oxide (SiOx), or the like is disposed on the gate lines 121 and the reference electrode lines 131. The gate insulating layer 140 may have a multi-layer structure including at least two insulating layers having different physical properties.

Semiconductor layers 151 made of hydrogenated amorphous silicon, polysilicon, or the like are disposed on the gate insulating layer 140. The semiconductor layers 151 substantially extend in a vertical direction. Each of the semiconductor layers 151 includes a protrusion 154 extending toward the gate electrode 124.

Ohmic contact stripes and islands (ohmic contact) 161 and 165 are disposed on the semiconductor layers 151. The ohmic contact stripes and islands 161 and 165 may be made of silicide or may be made of a material, such as n+ hydrogenated amorphous silicon heavily doped with n-type impurity such as phosphorus. Each of the ohmic contact stripes 161 includes a protruding ohmic contact 163. The protruding ohmic contact 163 and the ohmic contact island 165 are paired, and are disposed on the protrusion 154 of the semiconductor layer 151.

Data lines 171 and drain electrodes 175 are respectively disposed on the ohmic contact stripes and islands 161 and 165.

Each of the data lines 171 transfers a data signal, substantially extends in a vertical direction, and intersects with the gate lines 121 and the reference electrode lines 131. Each of the data lines 171 includes a data pad 179 having a wide area for connection to a source electrode 173 extending toward the gate electrode 124 and another layer or an external driving circuit.

The drain electrode 175 is separated from the data line 171 and faces the source electrode 173 with respect to the gate electrode 124. The drain electrode 175 includes a rod-shaped one side end portion and an extension having a wide area. The rod-shaped one-side end portion is partially surrounded by the source electrode 173 which is bent.

The gate electrode 124, the source electrode 173, and the drain electrode 175 constitute a single thin-film transistor (TFT) along with the protrusion 154 of the semiconductor layer 151. A channel of the thin-film transistor is formed in the protrusion 154 of the semiconductor layer 151 between the source electrode 173 and the drain electrode 175.

The ohmic contact stripes and islands 161 and 165 exist only between the semiconductor layer 151, and the data line 171 and the drain electrode 175, and may reduce a contact resistance therebetween.

A pixel electrode 191 is disposed on the drain electrode 175 and the gate insulating layer 140.

The pixel electrode 191 has a plane shape covering a pixel area, and contacts the extension of the drain electrode 175 to receive a data voltage from the drain electrode 175. The pixel electrode 191 is made of a transparent conductive material such as indium tin oxide (ITO) and indium zinc oxide (IZO).

A first passivation layer 180p is disposed on the data lines 171, the drain electrode 175, the pixel electrode 191, and an exposed portion of the protrusion 154 of the semiconductor layer 151.

The first passivation layer 180p may be made of silicon nitride (SiNx) and may have a thickness in a range of 200 Å to 400 Å. A ratio of nitrogen-hydrogen bonds (N—H) to silicon-hydrogen bonds (Si—H) of the first passivation layer 180p may be in a range of 22 to 24.

A second passivation layer 180q is disposed on the first passivation layer 180p.

The second passivation layer 180q may be made of silicon nitride and may have a thickness in a range of 2600 Å to 2800 Å. A ratio of nitrogen-hydrogen bonds (N—H) to silicon-hydrogen bonds (Si—H) of the second passivation layer 180q may be in a range of 0.9 to 1.1.

Conventionally, a single passivation layer having a ratio of nitrogen-hydrogen bonds (N—H) to silicon-hydrogen bonds (Si—H) in a range of 0.9 to 1.1 may be used in a conventional thin-film transistor array panel. In this case, arcing may occur during a process for disposing the passivation layer, which may cause damage to a substrate due to the arcing.

According to the present exemplary embodiment, the first and second passivation layers 180p and 180q having different ratios of nitrogen-hydrogen bonds (N—H) to silicon-hydrogen bonds (Si—H) are disposed in a dual structure. In particular, the first passivation layer 180p having the ratio of nitrogen-hydrogen bonds (N—H) to silicon-hydrogen bonds (Si—H) in a range of 22 to 24 is disposed, to prevent occurrence of arcing during a process for forming the passivation layer, thereby preventing a damage to a substrate.

A reference electrode line exposure opening 187 exposing the connection part 135 of the reference electrode line 131 is formed in the first passivation layer 180p, the second passivation layer 180q, and the gate insulating layer 140. In addition, a data pad exposure opening 182 exposing the data pad 179 is formed in the first passivation layer 180p and the second passivation layer 180q.

A reference electrode 270 and a contact assistant 82 are disposed on the second passivation layer 180q. The reference electrode 270 and the contact assistant 82 are made of a transparent conductive material such as indium tin oxide (ITO) and indium zinc oxide (IZO). Alternatively, the reference electrode 270 and the contact assistant 82 may be made of an opaque conductive material including aluminum-based metal, such as aluminum (Al) or aluminum alloy, silver-based metal, such as silver or silver alloy, molybdenum-based metal, such as molybdenum (Mo) or molybdenum alloy, chrome (Cr), tantalum (Ta), and titanium (Ti).

The reference electrode 270 is connected to the connection part 135 of the reference electrode line 131 through the reference electrode line exposure opening 187 and receives a reference voltage from the reference electrode line 131.

The reference electrode 270 includes branch electrodes 271. The branch electrodes 271 of the reference electrode 270 extend substantially parallel with the gate lines 121 and may be inclined at an angle of about 5° to about 20° with respect to the gate line 121.

The reference electrode 270 for one pixel is connected to the reference electrode 270 of another pixel adjacent thereto in a column direction.

The pixel electrode 191 to which the data voltage is applied generates an electric field along with the reference electrode 270 which receives the reference voltage, and therefore, liquid crystal molecules of a liquid crystal layer (not shown) disposed on the pixel electrode 191 and the reference electrode 270 may rotate in a parallel direction with respect to a direction of the electric field. Polarization of light passing through a crystal liquid layer may vary depending on a rotation direction of the liquid crystal molecules described above.

Although the pixel electrode is illustrated as having a plane shape and the reference electrode is illustrated as including branch electrodes in the present exemplary embodiment, according to an exemplary embodiment of the present invention, the pixel electrode may include branch electrodes and the reference electrode may include a plane shape.

The contact assistant 82 contacts the data pad 179 through the data pad exposure opening 182.

A transmittance of a thin-film transistor array panel according to an exemplary embodiment of the present invention will be described with reference to FIG. 5.

Figure 5:
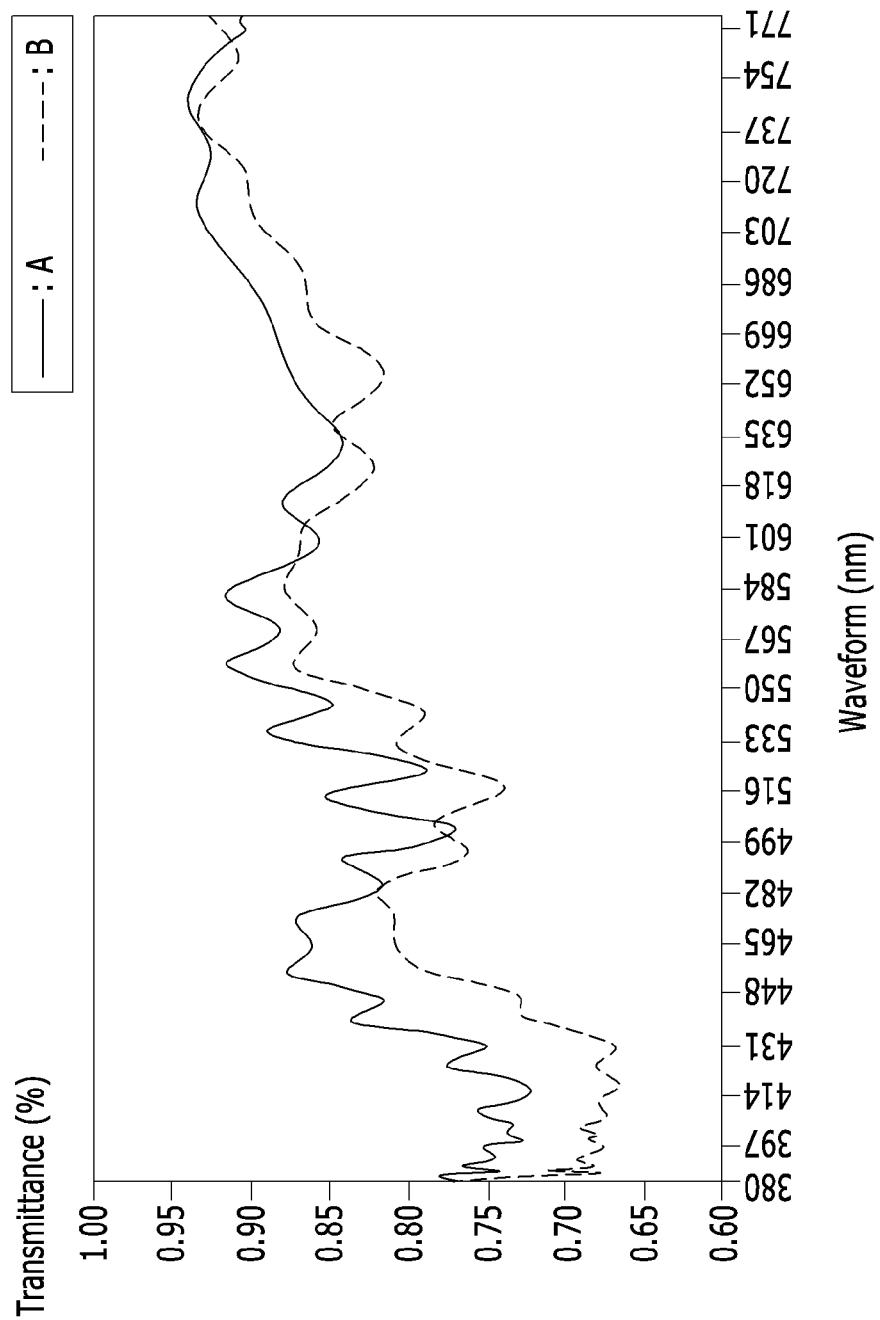
FIG. 5 is a graph comparing a transmittance of a thin-film transistor array panel according to an exemplary embodiment of the present invention with a transmittance of a conventional thin-film transistor array panel.

FIG. 5 is a graph comparing a transmittance of a thin-film transistor array panel according to an exemplary embodiment of the present invention with a transmittance of a conventional thin-film transistor array panel.

In FIG. 5, reference sign A indicates a transmittance of a thin-film transistor array panel according to an exemplary embodiment of the present invention and reference sign B indicates a transmittance of a conventional thin-film transistor array panel. The conventional thin-film transistor array panel has a single film structure having a ratio of nitrogen-hydrogen bonds (N—H) to silicon-hydrogen bonds (Si—H) of a passivation layer in a range of 0.9 to 1.1.

Referring to FIG. 5, a transmittance for the thin-film transistor array panel according to an exemplary embodiment of the present invention, in which a double-structure passivation film having a double-structured passivation layer is disposed, is higher than a transmittance of the conventional thin-film transistor array panel.

Hereinafter, a thin-film transistor array panel according to an exemplary embodiment of the present invention will be described with reference to FIGS. 6 to 9.

Figure 6:
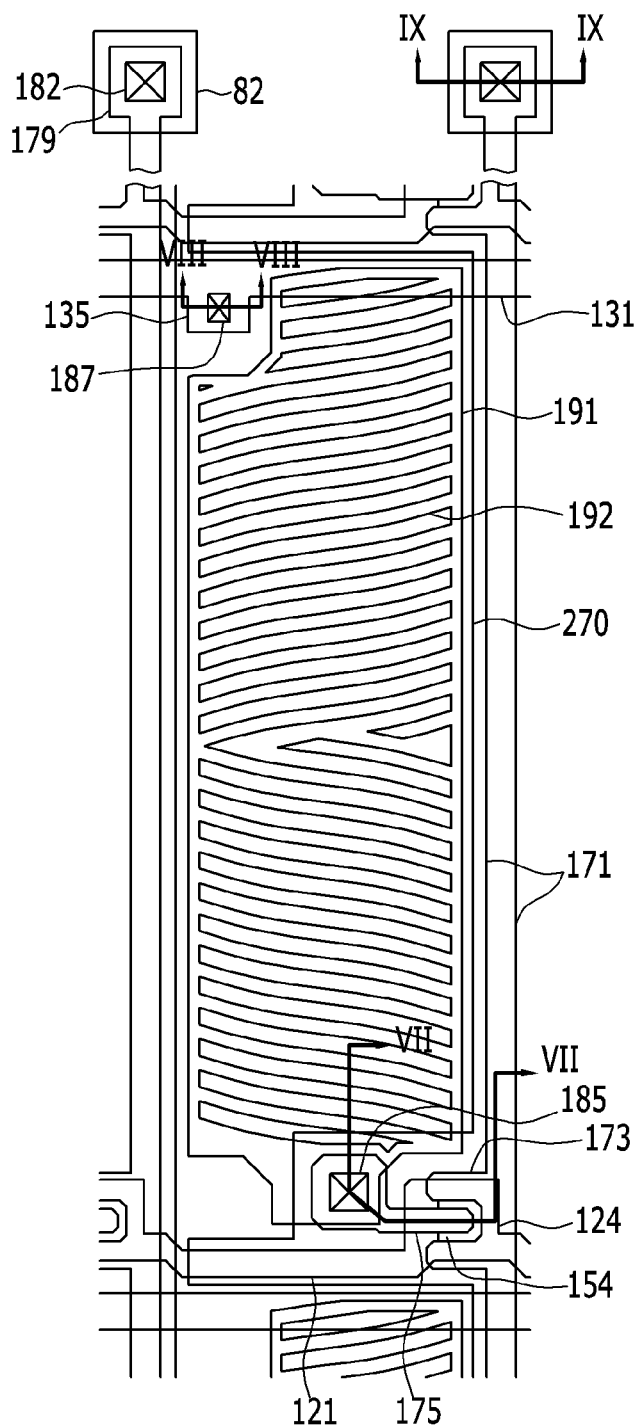
FIG. 6 is a layout view illustrating a thin-film transistor array panel according to an exemplary embodiment of the present invention.
Figure 7:
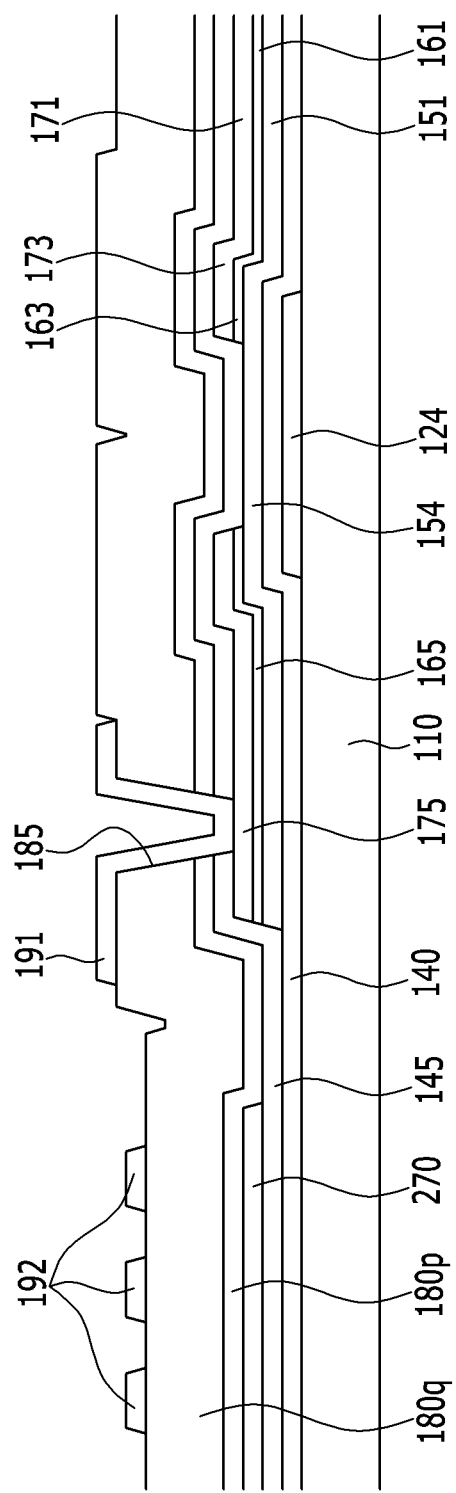
FIG. 7 is a cross-sectional view of the thin-film transistor array panel of FIG. 6, taken along line VII-VII.
Figure 8:
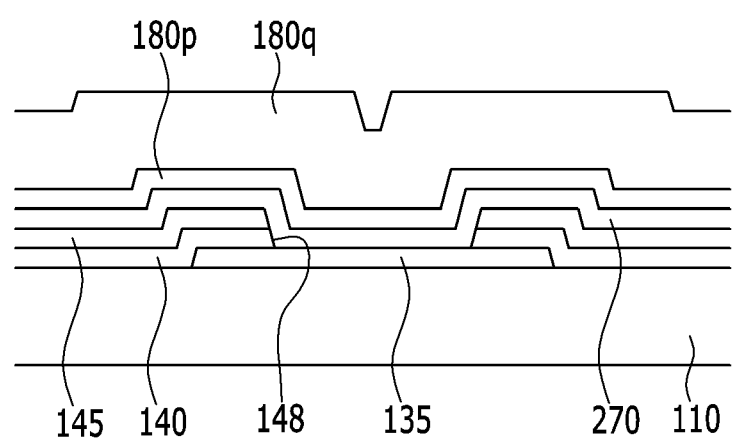
FIG. 8 is a cross-sectional view of the thin-film transistor array panel of FIG. 6, taken along line VIII-VIII.
Figure 9:
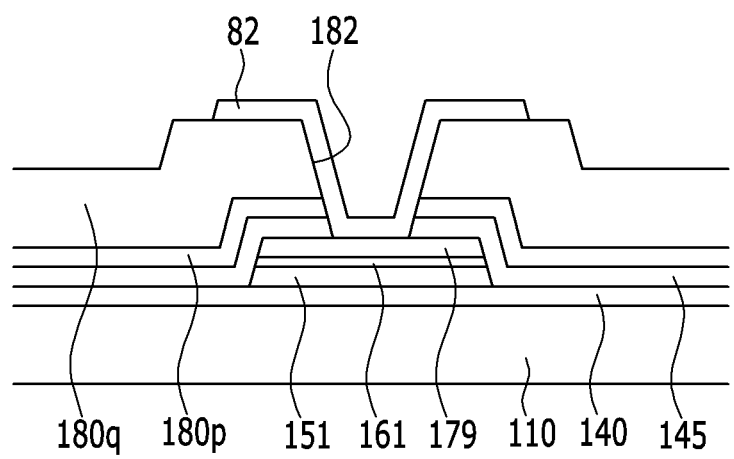
FIG. 9 is a cross-sectional view of the thin-film transistor array panel of FIG. 6, taken along line IX-IX.

FIG. 6 is a layout view illustrating a thin-film transistor array panel according to an exemplary embodiment of the present invention. FIG. 7 is a cross-sectional view of the thin-film transistor array panel of FIG. 6, taken along line VII-VII. FIG. 8 is a cross-sectional view of the thin-film transistor array panel of FIG. 6, taken along line VIII-VIII. FIG. 9 is a cross-sectional view of the thin-film transistor array panel of FIG. 6, taken along line IX-IX.

Referring to FIGS. 6 to 9, the thin-film transistor array panel according to an exemplary embodiment of the present invention includes gate lines 121 and reference electrode lines 131, which are disposed on an insulation substrate 110 made of a transparent glass or plastic material.

Each of the gate lines 121 transfers a gate signal and substantially extends in a horizontal direction. Each of the gate lines 121 includes gate electrodes 124 protruding upward therefrom and a gate pad (not shown) for connection to another layer or an external driving circuit.

The reference electrode lines receive a reference voltage, and extend substantially parallel with the gate line 121. Each of the reference electrode lines 131 includes a connection part 135, each protruding downward therefrom.

A gate insulating layer 140 made of silicon nitride (SiNx), silicon oxide (SiOx), or the like is disposed on the gate lines 121 and the reference electrode lines 131. The gate insulating layer 140 may have a multi-layer structure including at least two insulating layers having different physical properties.

Semiconductor layers 151 made of hydrogenated amorphous silicon, polysilicon, or the like are disposed on the gate insulating layer 140. The semiconductor layers 151 substantially extend in a vertical direction. Each of the semiconductor layers 151 includes a protrusion 154 extending toward the gate electrode 124.

Ohmic contact stripes and islands (ohmic contact) 161 and 165 are disposed on the semiconductor layers 151. The ohmic contact stripes and islands 161 and 165 may be made of silicide or may be made of a material, such as n+ hydrogenated amorphous silicon heavily doped with n-type impurity such as phosphorus. Each of the ohmic contact stripes 161 includes a protruding ohmic contact 163. The protruding ohmic contact 163 and the ohmic contact island 165 are paired and are disposed on the protrusion 154 of the semiconductor layer 151.

Data lines 171 and drain electrodes 175 are formed on the ohmic contact stripes and islands 161 and 165.

Each of the data lines 171 transfers a data signal and substantially extends in a vertical direction, and intersects with the gat lines 121 and the reference electrode lines 131. Each of the data lines 171 includes a data pad 179 having a wide area for connection to a source electrode 173 extending toward the gate electrode 124 and another layer or an external driving circuit.

The drain electrode 175 is separated from the data line and faces the source electrode 173 with respect to the gate electrode 124. The drain electrode 175 includes a rod-shaped one side end portion and an extension having a wide area. The rod-shaped one-side end portion is partially surrounded by the source electrode 173 which is bent.

The ohmic contact stripes and islands 161 and 165 exist only between the semiconductor layer 151, and the data line 171 and the drain electrode 175, and may reduce a contact resistance therebetween.

An interlayer insulating layer 145 is disposed on the gate insulating layer 140, the data lines 171, the drain electrode 175, and an exposed portion of the protrusion 154 of the semiconductor layer 151. A reference electrode line exposure opening 187 exposing the connection part 135 of the reference electrode line 131 is formed in the interlayer insulating layer 145 and the gate insulating layer 140.

A reference electrode 270 is disposed on the interlayer insulating layer 145. The reference electrode 270 has a plane shape covering a pixel area. The reference electrode 270 is connected to the connection part 135 of the reference electrode line 131 through the reference electrode line exposure opening 187 and receives a reference voltage from the reference electrode line 131. The reference electrode 270 is made of a transparent conductive material such as ITO or IZO. In addition, the reference electrode 270 for one pixel is connected to the reference electrode 270 of another pixel adjacent thereto in a column direction.

A first passivation layer 180p is disposed on the reference electrode 270 and the interlayer insulating layer 145.

The first passivation layer 180p may be made of silicon nitride (SiNx) and may have a thickness in a range of 200 Å to 400 Å. The ratio of nitrogen-hydrogen bonds (N—H) to silicon-hydrogen bonds (Si—H) of the first passivation layer 180p may be in a range of 22 to 24.

A second passivation layer 180q is disposed on the first passivation layer 180p.

The second passivation layer 180q may be made of silicon nitride and may have a thickness in a range of 2600 Å to 2800 Å. The ratio of nitrogen-hydrogen bonds (N—H) to silicon-hydrogen bonds (Si—H) of the second passivation layer 180q may be in a range of 0.9 to 1.1.

Since the first passivation layer 180p having the ratio of nitrogen-hydrogen bonds (N—H) to silicon-hydrogen bonds (Si—H) in a range of 22 to 24 is disposed as described above, to prevent occurrence of arcing during a process for forming the passivation layer, and thereby preventing a damage to a substrate.

A drain electrode exposure opening 185 exposing the drain electrode 175 is formed in the interlayer insulating layer 145, the first passivation layer 180p and the second passivation layer 180q. In addition, a data pad exposure opening 182 exposing the data pad 179 is formed in the interlayer insulating layer 145, the first passivation layer 180p, and the second passivation layer 180q.

A pixel electrode 191 and a contact assistant 82 are disposed on the second passivation layer 180q. The pixel electrode 191 is connected to the drain electrode 175 through the drain electrode exposure opening 185 to receive a data voltage from the drain electrode 175.

The contact assistant 82 contacts the data pad 179 through the data pad exposure opening 182.

The pixel electrode 191 and the contact assistant 82 are made of a transparent conductive material, such as ITO or IZO. Alternatively, the pixel electrode 191 and the contact assistant 82 may be made of an opaque conductive material including aluminum-based metal, such as aluminum (Al) or aluminum alloy, silver-based metal, such as silver or silver alloy, molybdenum-based metal, such as molybdenum (Mo) or molybdenum alloy, chrome (Cr), tantalum (Ta), and titanium (Ti).

The pixel electrode 191 includes branch electrodes 192. The branch electrodes 192 of the pixel electrode 191 extend substantially parallel with the gate lines 121 and may be inclined at an angle of about 5° to about 20° with respect to the gate line 121.

The pixel electrode 191 to which the data voltage is applied generates an electric field along with the reference electrode 270 to which the reference voltage is applied, and therefore, liquid crystal molecules of a liquid crystal layer (not shown) disposed on the pixel electrode 191 and the reference electrode 270 may rotate in a parallel direction with respect to a direction of the electric field. Polarization of light passing through a crystal liquid layer may vary depending on a rotation direction of the liquid crystal molecules as described above.

Although the reference electrode is illustrated as having a plane shape and the pixel electrode is illustrated as including the branch electrodes in the exemplary embodiment of the present invention, according to an exemplary embodiment of the present invention, the reference electrode may include branch electrodes and the pixel electrode may include a plane shape.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A thin-film transistor array panel, comprising:
an insulation substrate;
a gate line disposed on the insulation substrate;
a gate insulating layer disposed on the gate line;
a semiconductor layer disposed on the gate insulating layer;
a data line disposed on the semiconductor layer and comprising a source electrode;
a drain electrode disposed on the semiconductor layer and facing the source electrode;
a first electrode disposed on the gate insulating layer;
a first passivation layer disposed on the first electrode and comprising silicon nitride;
a second passivation layer disposed on the first passivation layer and comprising silicon nitride; and
a second electrode disposed on the first and second passivation layers,
wherein a first ratio of nitrogen-hydrogen bonds to silicon-hydrogen bonds in the first passivation layer is different from a second ratio of nitrogen-hydrogen bonds to silicon-hydrogen bonds in the second passivation layer.

2. The thin-film transistor array panel of claim 1, wherein the first ratio is in a range of 22 to 24.

3. The thin-film transistor array panel of claim 2, wherein the first passivation layer has a thickness in a range of 200 Å to 400 Å.

4. The thin-film transistor array panel of claim 3, wherein the second ratio is in a range of 0.9 to 1.1.

5. The thin-film transistor array panel of claim 4, wherein the second passivation layer has a thickness in a range of 2600 Å to 2800 Å.

6. The thin-film transistor array panel of claim 5, further comprising a reference electrode line disposed on the same layer with the gate line and spaced apart from the gate line, wherein the reference electrode line comprises a connection part protruding downwards.

7. The thin-film transistor array panel of claim 6, wherein the first electrode has a plate shape and the second electrode comprises branch electrodes.

8. The thin-film transistor array panel of claim 7, wherein the first electrode comprises a pixel electrode and the second electrode comprises a reference electrode.

9. The thin-film transistor array panel of claim 8, further comprising a reference electrode line exposure opening disposed in the gate insulating layer, the first passivation layer, and the second passivation layer and exposing the connection part.

10. The thin-film transistor array panel of claim 9, wherein:
the first electrode is disposed on and directly connected to the drain electrode; and
the second electrode is connected to the connection part through the reference electrode line exposure opening.

11. The thin-film transistor array panel of claim 7, wherein the first electrode comprises a reference electrode and the second electrode comprises a pixel electrode.

12. The thin-film transistor array panel of claim 11, further comprising an interlayer insulating layer disposed on the first passivation layer, the gate insulating layer, the data line, and the drain electrode,
wherein the first electrode is disposed on the interlayer insulating layer.

13. The thin-film transistor array panel of claim 12, wherein the gate insulating layer and the interlayer insulating layer comprise a reference electrode line exposure opening exposing the connection part.

14. The thin-film transistor array panel of claim 13, wherein the first electrode is connected to the connection part through the reference electrode line exposure opening.

15. The thin-film transistor array panel of claim 14, wherein the gate insulating layer, the interlayer insulating layer, the first passivation layer, and the second passivation layer comprise a drain electrode exposure opening exposing the drain electrode.

16. The thin-film transistor array panel of claim 15, wherein the second electrode is connected to the drain electrode through the drain electrode exposure opening.

17. The thin-film transistor array panel of claim 10, further comprising:
a first ohmic contact disposed between the drain electrode and the semiconductor layer; and
a second ohmic contact disposed between the source electrode and the semiconductor layer.

18. A method of forming a thin-film transistor array panel, the method comprising:
forming a gate line on an insulation substrate;
forming a gate insulating layer on the gate line;
forming a semiconductor layer on the gate insulating layer;
forming a source electrode and a drain electrode on the semiconductor layer to face each other;
forming a first electrode on the gate insulating layer;
forming a first passivation layer having a first ratio of nitrogen-hydrogen bonds to silicon-hydrogen bonds on the first electrode;
forming a second passivation layer having a second ratio of nitrogen-hydrogen bonds to silicon-hydrogen bonds different from the first ratio on the first passivation layer; and
forming a second electrode on the first and second passivation layers,
wherein the first and second passivation layers comprise silicon nitride.

19. The method of claim 18, wherein:
the first passivation layer has a thickness in a range of 200 Å to 400 Å;
the second passivation layer has a thickness in a range of 2600 Å to 2800 Å;
the first ratio is in a range of 22 to 24;
the second ratio is in a range of 0.9 to 1.1; and
the first electrode comprises a pixel electrode and the second electrode comprises branch electrodes.

20. The method of claim 18, wherein:
the first passivation layer has a thickness in a range of 200 Å to 400 Å;
the second passivation layer has a thickness in a range of 2600 Å to 2800 Å;
the first ratio is in a range of 22 to 24;
the second ratio is in a range of 0.9 to 1.1; and
the first electrode comprises branch electrodes and the second electrode comprises a pixel electrode.

* * * * *